(12) United States Patent
Hud et al.

(10) Patent No.: US 11,502,045 B2
(45) Date of Patent: Nov. 15, 2022

(54) ELECTRONIC DEVICE WITH STEP CUT LEAD

(71) Applicant: Texas Instruments Incorporated, Dallas, TX (US)

(72) Inventors: Amirul Afiq bin Hud, Melaka (MY); Wei Fen Sueann Lim, Melaka (MY); Adi Irwan Herman, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/254,718

(22) Filed: Jan. 23, 2019

(65) Prior Publication Data

US 2020/0235057 A1 Jul. 23, 2020

(51) Int. Cl.
| | |
|---|---|
| *H01L 23/00* | (2006.01) |
| *H01L 21/48* | (2006.01) |
| *H01L 23/495* | (2006.01) |
| *H01L 23/31* | (2006.01) |
| *H01L 21/56* | (2006.01) |
| *H01L 21/78* | (2006.01) |

(52) U.S. Cl.
CPC ........ *H01L 23/562* (2013.01); *H01L 21/4825* (2013.01); *H01L 21/4842* (2013.01); *H01L 21/565* (2013.01); *H01L 21/78* (2013.01); *H01L 23/3114* (2013.01); *H01L 23/49555* (2013.01)

(58) Field of Classification Search
CPC ......... H01L 23/49513; H01L 23/49555; H01L 23/562; H01L 21/4825; H01L 21/4842; H01L 21/565; H01L 21/78; H01L 23/3114; H01L 23/3107; H01L 2224/97; H01L 23/49562; H01L 23/49548
See application file for complete search history.

(56) References Cited

U.S. PATENT DOCUMENTS

| | | | | |
|---|---|---|---|---|
| 5,563,443 | A | * | 10/1996 | Beng ................... H01L 23/4951 257/666 |
| 6,157,074 | A | * | 12/2000 | Lee ......................... H01L 24/48 257/666 |
| 9,013,028 | B2 | | 4/2015 | Lee et al. |
| 9,013,030 | B2 | * | 4/2015 | Sivaperumal ..... H01L 23/49582 257/676 |
| 9,184,119 | B2 | | 11/2015 | Eugene Lee et al. |
| 9,324,640 | B1 | | 4/2016 | Eugene Lee et al. |
| 9,496,206 | B2 | | 11/2016 | Eugene Lee et al. |
| 9,515,009 | B2 | | 12/2016 | Fen et al. |
| 9,691,748 | B2 | | 6/2017 | Eugene Lee et al. |
| 9,741,643 | B2 | | 8/2017 | Lee et al. |
| 9,842,801 | B2 | | 12/2017 | Eugene Lee et al. |
| 9,859,197 | B2 | | 1/2018 | Eugene Lee et al. |
| 9,892,936 | B2 | | 2/2018 | Lim et al. |
| 10,115,660 | B2 | | 10/2018 | Lee et al. |

(Continued)

*Primary Examiner* — Steven B Gauthier
*Assistant Examiner* — Khatib A Rahman
(74) *Attorney, Agent, or Firm* — Ronald O. Neerings; Charles A. Brill; Frank D. Cimino

(57) ABSTRACT

An electronic device includes a semiconductor die, an enclosure, leads extending outwardly from the enclosure and electrically connected to the semiconductor die, and wherein the leads have a reduced cross-sectional area along a longitudinal length of the lead. The electronic device is designed to reduce the occurrence of crack formation between the leads and a printed circuit board.

41 Claims, 10 Drawing Sheets

(56) References Cited

U.S. PATENT DOCUMENTS

| | | | |
|---|---|---|---|
| 2006/0220191 A1* | 10/2006 | Sundstrom | H01L 23/49541 257/669 |
| 2006/0255436 A1* | 11/2006 | Ozawa | H01L 23/4951 257/666 |
| 2012/0126384 A1* | 5/2012 | Meng | H01L 23/49503 257/670 |
| 2012/0164794 A1* | 6/2012 | Xue | H01L 23/49575 438/123 |
| 2013/0127029 A1 | 5/2013 | Lee et al. | |
| 2014/0104790 A1* | 4/2014 | Yoon | H01L 23/562 361/716 |
| 2014/0145193 A1* | 5/2014 | Kadoguchi | H01L 23/4952 257/48 |
| 2014/0159216 A1* | 6/2014 | Ishino | H01L 23/4006 257/675 |
| 2015/0001691 A1* | 1/2015 | Higgins, III | H01L 21/56 257/666 |
| 2015/0060123 A1 | 3/2015 | Eugene Lee et al. | |
| 2015/0214136 A1 | 7/2015 | Lee et al. | |
| 2015/0243586 A1* | 8/2015 | Wang | H01L 23/49568 257/676 |
| 2015/0380342 A1* | 12/2015 | Kashiwazaki | H01L 24/06 257/666 |
| 2016/0181122 A1 | 6/2016 | Eugene Lee et al. | |
| 2017/0025332 A1 | 1/2017 | Eugene Lee et al. | |
| 2017/0271246 A1* | 9/2017 | Macheiner | H01L 21/4825 |
| 2017/0345743 A1 | 11/2017 | Lee et al. | |
| 2017/0345790 A1 | 11/2017 | Eugene Lee et al. | |
| 2018/0122724 A1 | 5/2018 | Lee et al. | |
| 2018/0145032 A1* | 5/2018 | Pu | H01L 21/76885 |

\* cited by examiner

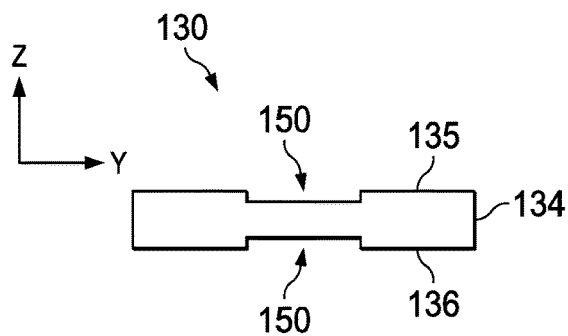
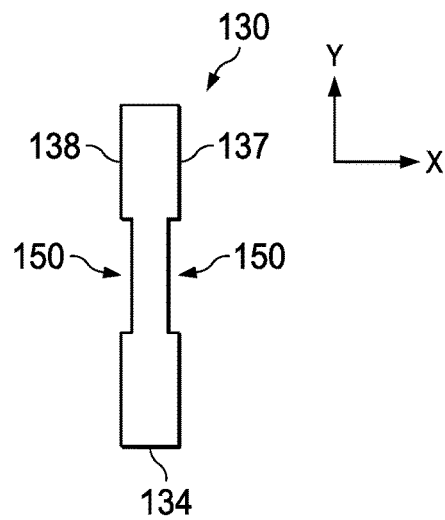
FIG. 9  FIG. 10
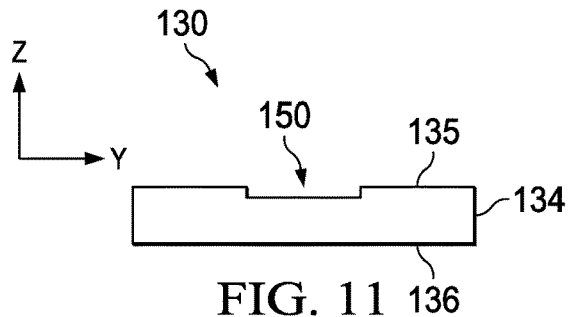
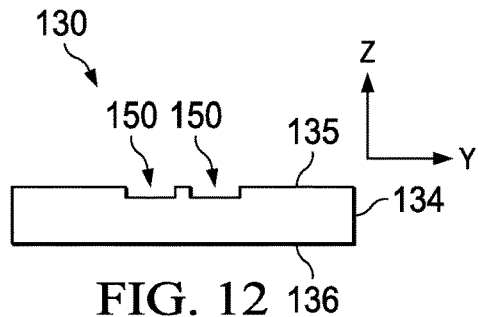
FIG. 11  FIG. 12
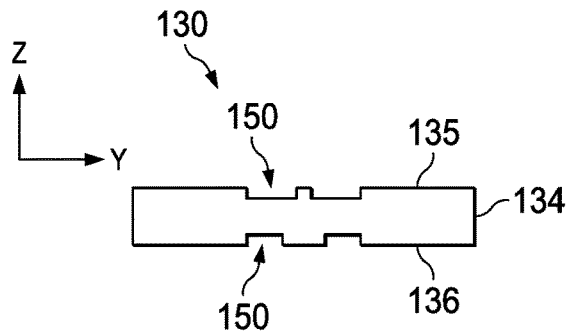
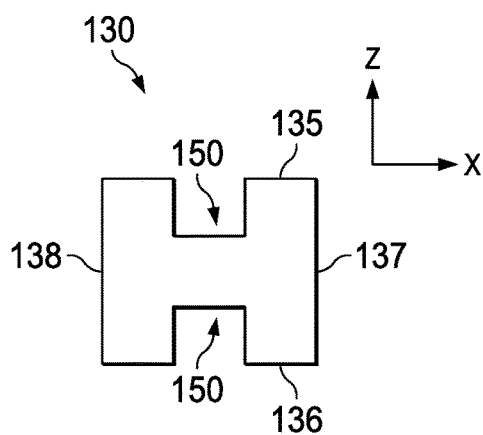
FIG. 13  FIG. 14

ELECTRONIC DEVICE WITH STEP CUT LEAD

BACKGROUND

Semiconductor components and integrated circuits are generally contained in electronic devices and interconnection to the electronic devices is obtained via metallic leads, generally of copper, conducting electrical current and heat from a semiconductor die into a printed circuit board (PCB) and its surroundings. The semiconductor die is mounted onto a die pad of a leadframe containing the leads, and metallic bond wires, typically gold, copper, or aluminum, are used to connect the semiconductor die's bond pads or other surface connections to the leads.

During manufacturing, the semiconductor die is attached to the die pad and then bond wires electrically connect the bond pads to the leads. Generally, the die pad and leads are part of a leadframe that is molded in a plastic case and the outside of the leadframe is cut off to separate the leads. Thereafter, the packaged device is separated from other packages, connected via their respective leadframes, by mechanical sawing or by mechanical punching. The metallic leads of the leadframe are then formed into J-wing leads or "gull wing" leads using mechanical forming to set them into their final shape. The leads are bent so as to have a bent portion and a bottom flat portion that is coplanar for mounting on a flat surface of a PCB.

A conventional semiconductor die includes a semiconductor substrate with a metallization structure having at least one exposed metallized area on the surface to be directly electrically connected to a lead of the leadframe, or via a bond wire. The bond wire, typically comprising gold, copper, aluminum or some other conductive metallic alloys, can be used to electrically connects the semiconductor die bond pads to the leads. The leads typically extend laterally outside of the enclosure of the packaged electronic device. The leads are formed into a non-planar shape that includes a bent portion and a flat portion. Solder is typically used to electrically connect the flat portions of the leads to the PCB. During use of the electronic device in various applications, the solder connection between the lead and the PCB can crack or otherwise fully break, thereby leading to the malfunction or failure of the electronic device.

SUMMARY

Described examples include an electronic device with a semiconductor die, an enclosure, leads extending outwardly from the enclosure. The leads are electrically connected to the semiconductor die, and the leads have a reduced cross-sectional area along a longitudinal length of the lead. In one example, the reduced cross-sectional area on the leads is formed by a slot, notch, grove, or compressed region. In one example, the reduced cross-sectional area on the leads is formed by the slot, the notch, the grove, or the compressed region located on a top surface, a bottom surface, a right side and/or a left side of the lead.

An example method includes providing a leadframe that includes leads, providing a semiconductor die, attaching the semiconductor die to the leadframe, electrically connecting the semiconductor die to the leads of the leadframe, and reducing a cross-sectional area of the leads along a longitudinal length of the lead.

An example leadframe includes a die pad, and first and second leads connected to and extending outwardly from the die pad. The first and second leads have a reduced cross-sectional area along a longitudinal length of the first and second leads.

An example electronic system includes a semiconductor die, an enclosure, and leads extending outwardly from the enclosure and electrically connected to the semiconductor die. The leads have a reduced cross-sectional area along a longitudinal length of the leads. The system also includes a printed circuit board, and the leads on the electronic device are electrically connected to the printed circuit board.

BRIEF DESCRIPTION OF THE DRAWINGS

FIGS. 9-14 are illustrations of how portions of the leads of the leadframe can be reduced alone portions of the longitudinal length of the leads;

DETAILED DESCRIPTION

Figure 1:
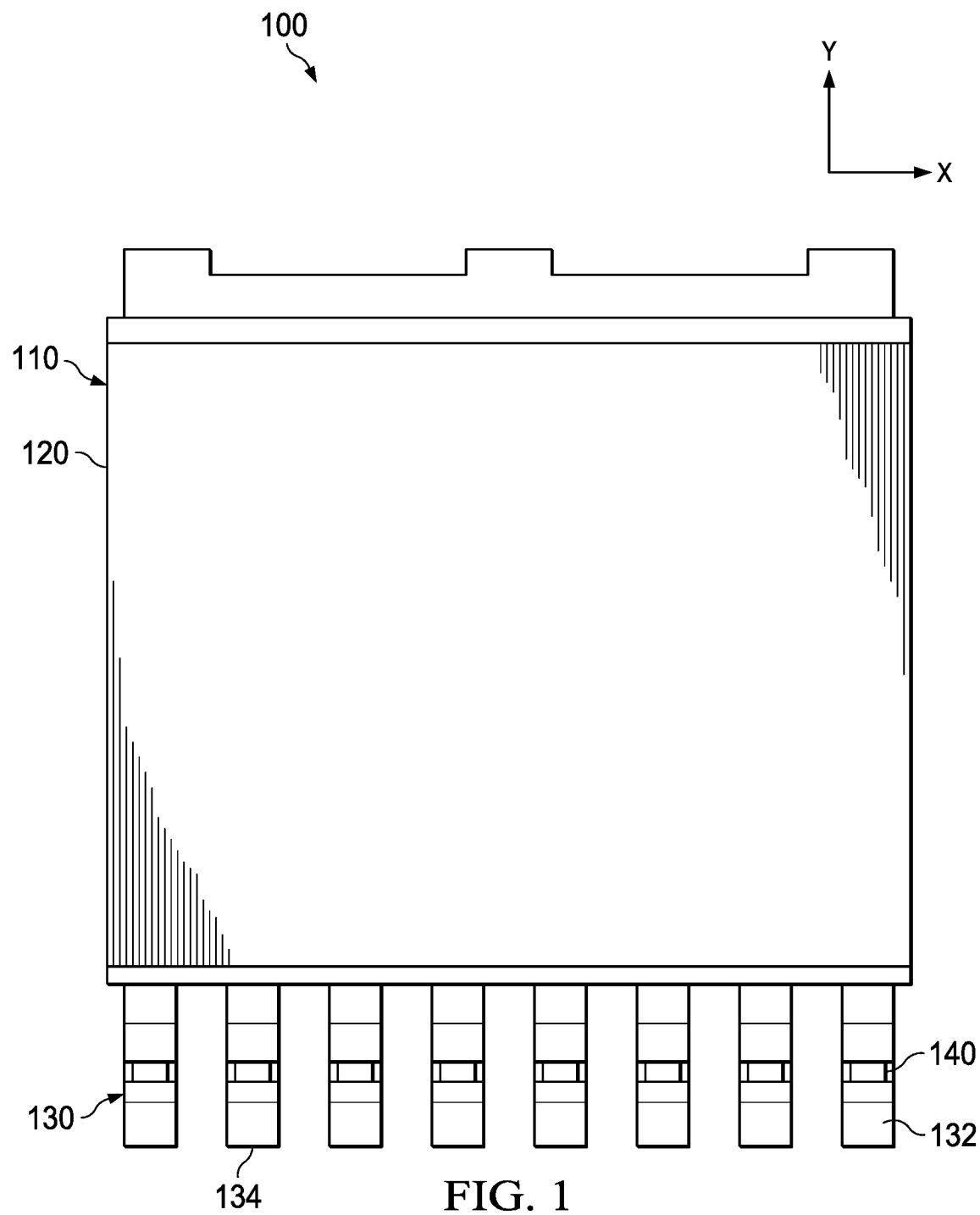
FIG. 1 is a top plan view of an electronic device that includes reduced cross-section regions on each of the leads.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via intervening devices and connections.

The various features of the disclosed examples can be used in connection with a variety of different electronic devices, such as integrated circuits having multiple electronic components, as well as single-component electronic devices (e.g., single transistor products, single diode products, etc.). The described examples relate to electronic devices and processes in general, specifically to semiconductor packaging devices and processes to fabricate and use surface mount packages in printed circuit board assemblies, and more specifically to electronic devices and processes that have improved resistance to joint cracking between the electronic device and printed circuit board (PCB).

The described examples illustrate and describe an electronic device 100 that can be connected to a PCB 400 to form an electronic system 420 and wherein an electrical connector 410 such as a solder connection between the leads 130 and the PCB 400 resists joint crack formation when the electronic device and the PCB are subjected to large stresses. These large stresses can result when the electronic device and the PCB are used in a host system (e.g., automotive vehicles, space satellites, manufacturing equipment, etc.) that undergoes large temperature changes (e.g., ±40° C.). For instance, some devices are exposed to temperature ranges from −40° C. to 120° C. during operation of the devices. In some high-powered devices, large temperature changes can also occur when high levels of current periodically flow through the leads. The stresses due to temperature changes are believed to be the result of the different compositions of the materials that form the connection between the electronic device and the PCB. The leads on the electronic device are commonly formed of copper, but can be formed of other types of electrically-conductive materials. The solder (e.g., lead alloy solder, lead-free solder, silver alloy solder, etc.) used to connect the leads to the metal connection points on the PCB generally has a different composition from the leads and metal connection points on the PCB. The metal connection points on the PCB are generally formed of copper or aluminum, but can be formed of other types of electrically-conductive materials. Due to the different compositions of the materials that form the connection between the electronic device and the PCB, these materials will undergo a different degree of thermal expansion when subjected to a range of temperatures. It is believed that that such differing thermal expansions can result in cracks forming in the electrical connector 410 during the operation of a device that is subjected to such varying temperature environments. Once a crack is formed in the solder connection, the crack can continue to creep through the solder connection during operation of the device until the electronic system 420 begins to malfunction or ultimately fail.

The described examples provide an electronic device 100 that can be connected to a PCB 400 to form an electronic system 420 that includes modifications to the leads 130 on the electronic device 100 that reduce the stress on the electrical connector 410 between the leads and the PCB when the electronic system 420 is subjected to thermal fluctuations. The leads 130 on the electronic device 100 have a reduced cross-sectional area on at least one portion of the lead along the longitudinal length of the lead. As defined herein "a reduced cross-sectional region" is a first portion of the lead 130 that has a smaller cross-sectional area between adjacently positioned second and third portions having larger cross-sectional areas than the first portion of the lead 130. As such, the "a reduced cross-sectional region" is located between the end 134 of the lead 130 and the portion of the lead 130 that first extends from the enclosure 120 of the electronic device 110. A lead that has a region that includes a slot, notch, grove, or compressed region will have a smaller cross-sectional area than a portion of the lead that is absent such slot, notch, grove, or compressed region. The reduction in the cross-sectional area of the lead results in increased flexibility of the lead. Such increased flexibility reduces the amount of stress applied on the electrical connector 410 connection when the lead, electrical connector (e.g., solder), and the metal connection points on the PCB undergo thermal expansion when subjected to thermal fluctuations. The location, number and shape of the reduced cross-sectional areas on each of the leads can be the same or different. For instance, when the leads are used to conduct generally the same voltage and current levels between the semiconductor die 110 and the PCB 400, the location, number and shape of the reduced in cross-sectional area regions on each of the leads generally is, but is not required to be, the same. When a lead 130 is used to conduct a larger current than another other lead 130 between the semiconductor die 110 and the PCB 400, the location, number and shape of the reduced cross-sectional areas for such lead 130 that is configured to conduct higher current can be different from the other leads 130.

In one example, a coining process is used to form the reduced cross-sectional areas in one or more leads, for example, using a closed die forging process in which pressure is applied on the surface of the forging by placing the lead or leads between two shaped dies. Coining or other cross-sectional area reduction can be at any position or positions on a given lead, and can be of any size aspect of the coining area. The coining or other process to manufacture the reduced cross-sectional areas can be during back end processing (e.g., tie bar cutting) or during a leadframe supplier manufacturing process in example implementations. In certain examples, more than one reduced cross-sectional area can be provided on a given lead. In one example, one or more reduced cross-sectional areas are provided on certain leads, while other leads of a given device do not include a reduced cross-sectional area. In one example, this facilitates improved overall package flexibility as some leads provide stress relief, while other leads can be unmodified, for example, to support higher current flow.

An example method of forming an electronic device 100 includes providing a leadframe 600 that includes leads 130, and providing a semiconductor die 110. The method also includes attaching the semiconductor die 110 to the leadframe 600, electrically connecting the semiconductor die to the leads 130 of the leadframe 600, and reducing a cross-sectional area of one or more of the leads 130 along a longitudinal length of the lead 130. The method for reducing the cross-sectional area of the leads 130 can occur prior to or after the semiconductor die 110 is attached to the leadframe 600. As such, the leadframe can be preformed with the reduced cross-sectional areas along the longitudinal length of the lead 130. The leadframe can be preformed by standard manufacturing processes such as stamping, etching, etc. The reduced cross-sectional areas along the longitudinal length of the lead 130 can be formed by stamping, cutting, etching, compression molding, etc.

Figure 2:
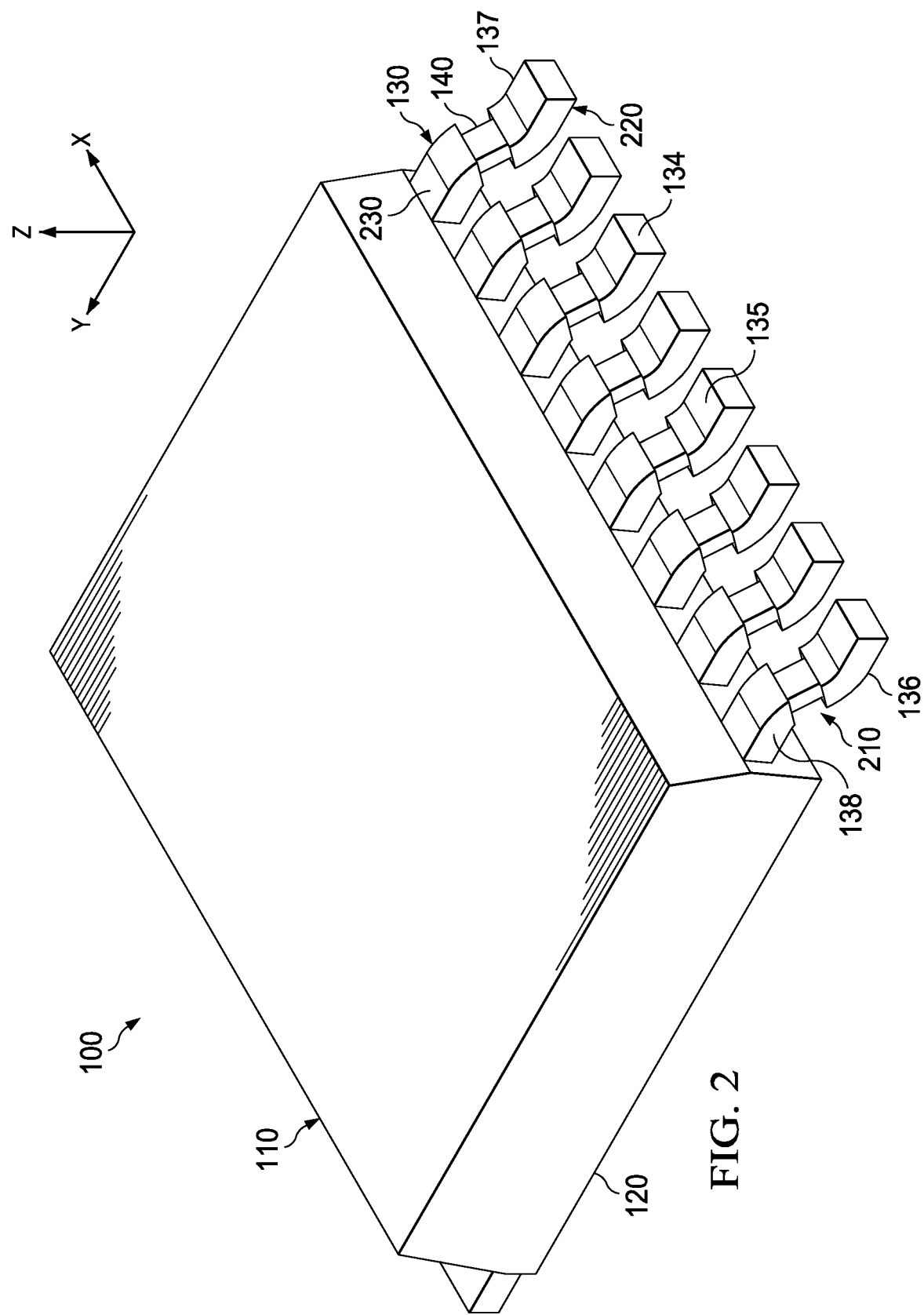
FIG. 2 is a front elevation view of the electronic device of FIG. 1.
Figure 3:
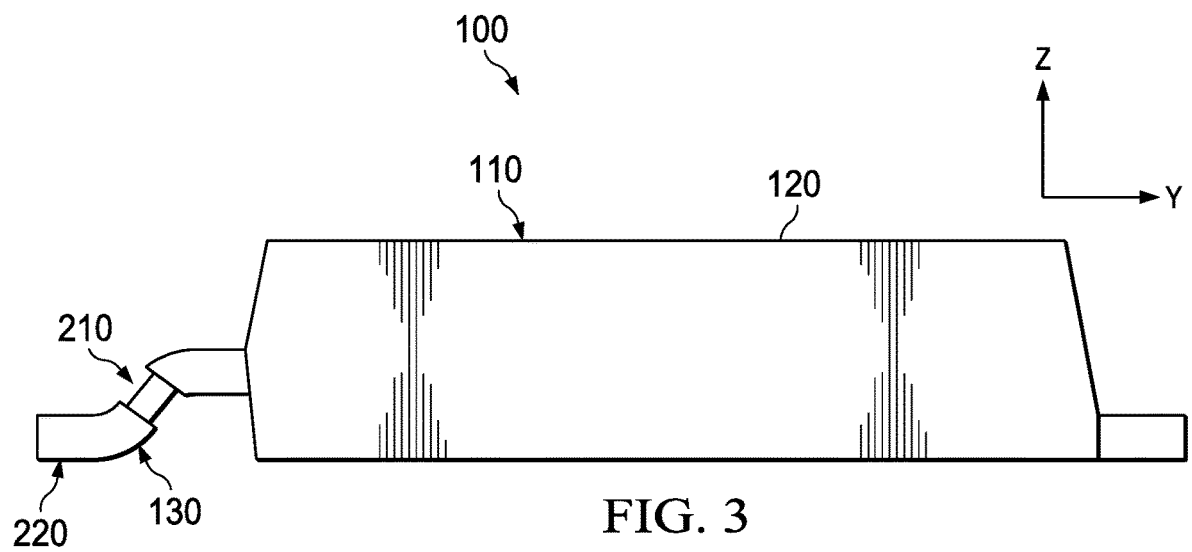
FIG. 3 is a right-side view of the electronic device of FIG. 1.

FIGS. 1-3 illustrate an electronic device 100 that includes a semiconductor die 110. The semiconductor die 110 includes an enclosure 120 such as a plastic enclosure. Multiple leads 130 are illustrated as extending outwardly from the enclosure 120. The leads 130 are typically made of an electrically-conductive metal such as copper or aluminum. The leads are electrically connected to the semiconductor die 110. The leads can be directly connected to electrical connections on the semiconductor die 110, or can be electrically connected to the semiconductor die 110 by bonding wires (not shown) which are typically formed of gold, copper or some other electrically-conductive metal. Any suitable lead length, cross-sectional area and cross-sectional shape of the leads can be used. One common lead used on electronic devices 100 has a square or rectangular cross-sectional shape and has width of 0.25-0.9 mm and height of 0.24-0.6 mm and a length of about 0.8-3 mm.

Figure 4:
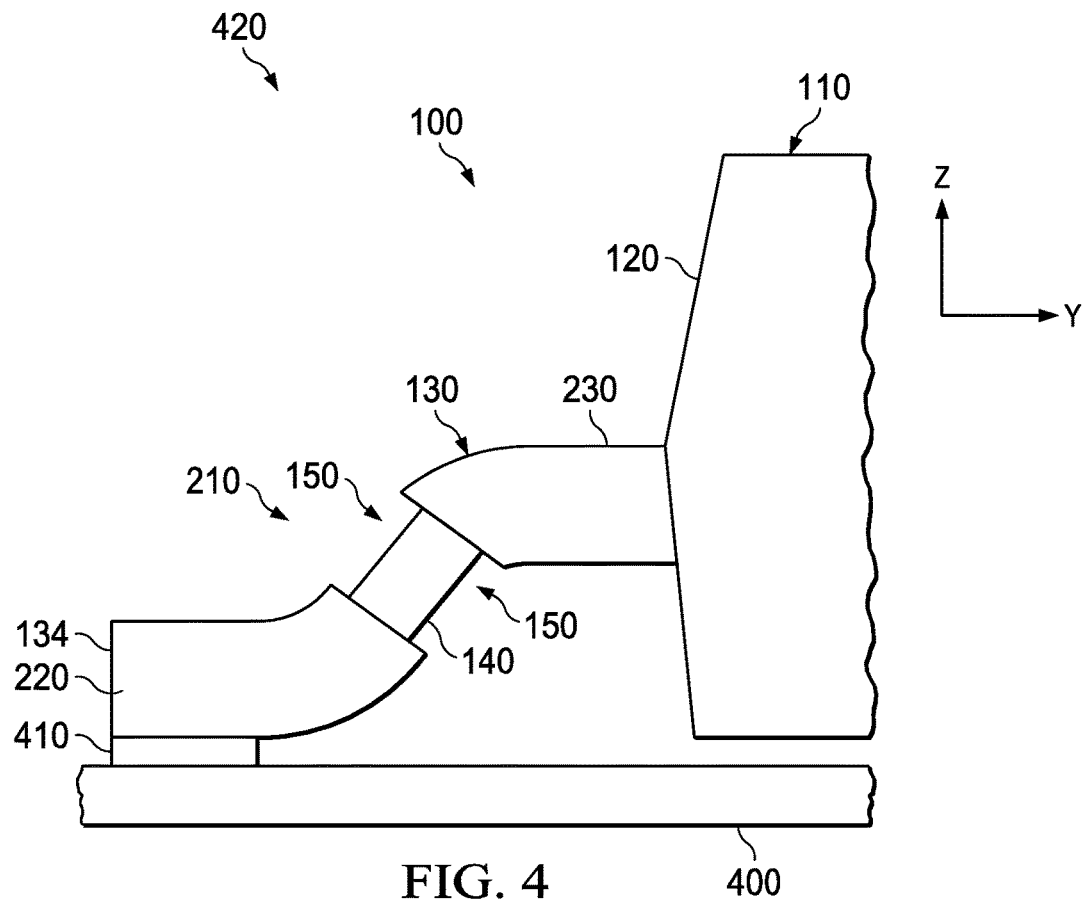
FIG. 4 is a partial enlarged side view of a host system, in which the electronic device of FIG. 1 is electrically connected to a PCB via a lead of the electronic device.

As illustrated in FIGS. 1-4, each of the leads 130 has a reduced cross-sectional area along a longitudinal length of the lead 130. In particular, each of the leads includes a reduced cross-section region 140 that is located between the enclosure 120 and the front end 134 of the lead 130. The lead includes a sloped region 210 and a flat region 220. The sloped region 210 is located between the flat region 220 and the enclosure 120. As best illustrated in FIG. 4, the reduced cross-section region 140 is located on the sloped region 210. The reduced cross-section region 140 is formed by slots 150 that have been stamped, etched or cut in the top surface, bottom surface and sides of the lead. The depth of the slots in the top and bottom surfaces of the leads can be the same, less, or greater than the depth of the slots on each side of the leads. The size, shape and depth of the slots in the top surface, bottom surface and sides of the lead can be the same or different. As illustrated in FIGS. 4, 9, 11-13, the cross-sectional shape of the slots 150 on the top and/or bottom surfaces 135, 136 of the leads is rectangular. As illustrated in FIG. 10, the cross-sectional shape of the slots 150 on the sides of the leads is rectangular. As can be appreciated, the cross-sectional shape of the slots 150 can have other shapes (e.g., square, arcuate, U-shaped, V-shaped, etc.). As will be described in more detail below, the reduced cross-sectional area along a longitudinal length of the lead 130 is configured to increase the flexibility of the lead 130 so as to reduce the stress on the electrical connector 410 (e.g., solder connection) that is used to connect the lead 130 to the PCB 400.

FIGS. 9-14 show example configurations of the reduced cross-sectional area on portions of the longitudinal length of the lead 130. Generally, the slots in the lead are spaced from the front end 134 of the lead. However, the positioning of the slots 150 in the lead can be such that once the lead 130 is bent, slots can be located on the flat portion 220, the sloped portion 210, and/or the pre-sloped portion 230. The depth of each of the slots 150 is generally less than 50% the thickness of the lead 130. When a slot is positioned in the top and/or bottom surface 135, 136 of the lead 130, the total thickness reduction in the lead for any given portion of the lead along the lead longitudinal length is generally no more than a 50% reduction in thickness so as to not compromise the integrity of the lead. Likewise, when slot is positioned in one or both sides 137, 138 of the lead 130, the total width reduction in the lead for any given portion of the lead along the lead longitudinal length is generally no more than a 50% reduction in width so as to not compromise the integrity of the lead. Also, the reduced cross-section region 140 on the leads 150 that are formed by slots 150 do not reduce the cross-sectional area of the lead 130 by more than 50% so as to not compromise the integrity of the lead. In one example arrangement, the reduced cross-section region 140 on any given portion of the lead along the lead longitudinal length reduces the cross-sectional area of the lead by 1% to 50% (and all values and ranges therebetween). In another example arrangement, the reduced cross-section region 140 on any given portion of the lead along the lead longitudinal length reduces the cross-sectional area of the lead by 5% to 40%. In another example arrangement, the reduced cross-section region 140 on any given portion of the lead along the lead longitudinal length reduces the cross-sectional area of the lead by 10% to 35%. Generally, the total longitudinal length of the reduced cross-section regions 140 along the longitudinal length of the lead 130 is no more than 75% of the total longitudinal length of the lead 130, wherein the total longitudinal length of the lead 130 is defined as the length of the lead 130 measured from the outer surface of enclosure 120 to the front end 134 of the lead 130. In one example arrangement, the total longitudinal length of the reduced cross-section regions 140 along the longitudinal length of the lead 130 is 5% to 75% (and all values and ranges therebetween of the total longitudinal length of the lead 130). In another example arrangement, the total longitudinal length of the reduced cross-section regions 140 along the longitudinal length of the lead 130 is 10% to 50% of the total longitudinal length of the lead 130. In another example arrangement, the total longitudinal length of the reduced cross-section regions 140 along the longitudinal length of the lead 130 is 10% to 45% of the total longitudinal length of the lead 130.

FIGS. 9 and 10 are representative of the slot configuration of the leads 130 illustrated in FIGS. 1-4. Each of the leads in FIGS. 1-4 have slots located on all four sides of the lead 130 and the slots are located at the same longitudinal position on the lead 130. The slots are spaced from the end 134 of the leads 130 and are also spaced from the enclosure 120. FIGS. 9 and 10 are side and top views respectively of the lead 130 prior to being bent. A slot 150 is located on the top surface 135 and bottom surface 136 of the lead 150. The slots 150 are spaced from the front end 134 of the lead 130. The two slots 150 shown in FIG. 9 and the two slots 150 shown in FIG. 10 are illustrated as having the same size, depth, longitudinal length and cross-sectional shape and being positioned at the same longitudinal location on the lead 130; however, this is not required. The total longitudinal length of the reduced cross-section regions 140 along the longitudinal length of the lead 130 as formed by slots 150 in FIGS. 9 and 10 is about 30% to 45% of the total longitudinal length of the lead 130. The reduced cross-section region 140 on the lead 130 along the lead longitudinal length of lead 130 as formed by slots 150 in FIGS. 9 and 10 reduces the cross-sectional area of the lead by 25% to 40%. In one particular example configuration, each of the leads has a generally uniform cross-sectional shape and cross-sectional area along the longitudinal length of the lead 130 except for the location of slots 150, and the height of the leads 130 is about 0.5 mm and the width of the leads 130 is about 0.8 mm, and the depth of each of the slots 150 on the top and bottom surfaces 135, 136 of the leads 130 is about 0.05 mm and the depth of each of the slots 150 on the right and left sides 137, 138 of the leads 130 is about 0.127 mm.

FIG. 11 is a side view of another example slot configuration in the lead 130. The lead 130 includes a single slot 150 on the top surface 135, but is absent a slot on the bottom surface 136. Slot 150 is spaced from the front end 134 of the lead 130. The lead 130 can optionally include a slot on the right side 137 and/or the left side 138 as illustrated in FIG. 10. As can be appreciated more than one or less than one slot can be located on the right side 137 and/or the left side 138 of the lead 130. When more than two slots are located on the right side 137 and/or the left side 138 of the lead 130, the slots 150 can have the same or different size, longitudinal length, depth, and/or cross-sectional shape. The total longitudinal length of the reduced cross-section regions 140 along the longitudinal length of the lead 130 as formed by slot 150 in FIG. 11 is about 30% to 45% of the total longitudinal length of the lead 130. The reduced cross-section region 140 on the lead 130 along the lead longitudinal length of lead 130 as formed by slot 150 in FIG. 11 reduces the cross-sectional area of the lead by 15% to 40%.

FIG. 12 is a side view of another example slot configuration in the lead 130. The lead 130 includes two slots 150 on the top surface 135, but is absent a slot on the bottom surface 136. Slots 150 are spaced from the front end 134 of the lead 130. The two slots are illustrated has having generally the same longitudinal length and depth; however, it can be appreciated that the two slots can have a different longitudinal length, a different depth, and/or a different cross-sectional shape. The lead 130 can optionally include a slot on the right side 137 and/or the left side 138 as illustrated in FIG. 10. As can be appreciated more than one or less than one slot can be located on the right side 137 and/or the left side 138 of the lead 130. When more than two slots are located on the right side 137 and/or the left side 138 of the lead 130, the slots 150 can have the same or different size, longitudinal length, depth, and/or cross-sectional shape. The total longitudinal length of the reduced cross-section regions 140 along the longitudinal length of the lead 130 as formed by slot 150 in FIG. 12 is about 30% to 45% of the total longitudinal length of the lead 130. The reduced cross-section region 140 on the lead 130 along the lead longitudinal length of lead 130 as formed by slots 150 in FIG. 12 reduces the cross-sectional area of the lead by 15% to 40%.

FIG. 13 is a side view of another example slot configuration in the lead 130. The lead 130 includes a different number of slots 150 on the top and bottom surfaces 135, 136 of the lead 130. The lead 130 has two slots 150 on the top surface 135 and three slots 150 on the bottom surface 136. The slots 150 are illustrated as having a different size and having the same depth and cross-sectional shape; however, this is not required. At least one of the slots 150 on the bottom surface 136 is not located under one of the slots 150 on the top surface 135 of the lead 130. The lead 130 can optionally include a slot on the right side 137 and/or the left side 138 as illustrated in FIG. 10. As can be appreciated more than one or less than one slot can be located on the right side 137 and/or the left side 138 of the lead 130. When more than two slots are located on the right side 137 and/or the left side 138 of the lead 130, the slots 150 can have the same or different size, longitudinal length, depth, and/or cross-sectional shape. The total longitudinal length of the reduced cross-section regions 140 along the longitudinal length of the lead 130 as formed by slot 150 in FIG. 13 is about 30% to 55% of the total longitudinal length of the lead 130. The reduced cross-section region 140 on the lead 130 along the lead longitudinal length of lead 130 as formed by slot 150 in FIG. 13 reduces the cross-sectional area of the lead by 20% to 45%.

FIG. 14 is a sectional view of a middle portion of the lead 130 as viewed from the front surface of the lead 130. A slot 150 is located on the top surface 135 and the bottom surface 136 of the lead 130 and runs partially along the longitudinal length of the lead 130. Although not shown, the front end of the slots 150 are spaced from the front end 134 of the lead 130. The sides of the slots are spaced from the right and left sides 137,138 of the lead 130. The slots 150 are illustrated as having the same depth, size and cross-sectional shape; however, this is not required. The lead 130 can optionally include a slot on the right side 137 and/or the left side 138 as illustrated in FIG. 10. As can be appreciated, more than one or less than one slot can be located on the right side 137 and/or the left side 138 of the lead 130. When more than two slots are located on the right side 137 and/or the left side 138 of the lead 130, the slots 150 can have the same or different size, longitudinal length, depth, and/or cross-sectional shape. The total longitudinal length of the reduced cross-section regions 140 along the longitudinal length of the lead 130 as formed by slots 150 in FIG. 14 is about 30% to 75% of the total longitudinal length of the lead 130. The reduced cross-section region 140 on the lead 130 along the lead longitudinal length of lead 130 as formed by slot 150 in FIG. 14 reduces the cross-sectional area of the lead by 20% to 45%.

As illustrated in FIG. 4, the flat portion 220 of lead 130 is electrically connected to the PCB 400 by an electrical connector 410 such as a metallic solder, an electrically-conductive epoxy, or the like. Any suitable composition and thickness of the electrical connector can be used. In one example arrangement, a slot 150 is absent on the bottom surface 136 of the lead 130 at the region of the flat portion 220 so to not interfere with the desired electrical connection between the flat portion 220 of the lead 130 and the PCB 400. When the electronic system 420 is used in a device that is subjected to thermal changes or other changes that cause the thermal expansion of the lead 150 during the operation of the electronic system 420, the thermal expansion and contraction of the lead 150 can cause undue stress on the electrical connector 410, thereby causing a crack to form and grow in the electrical connector 410. It has been found that such stress on the electrical connector 410 caused by the thermal expansion and contraction of the lead 150 can be reduced by changing the cross-sectional area of the lead 150 along at least a portion of the longitudinal length of the lead 130. It has been determined that by merely reducing the cross-sectional area of the lead 150 along at least a portion of the longitudinal length of the lead 130 by as little as 5% will increase the flexibility of the lead 130 and in turn reduce the stress on the electrical connector 410 caused by the thermal expansion and contraction of the lead 150. Such reduction in stress has been found to significantly reduce or eliminate the formation of cracks in the electrical connector 410 when the electronic system 420 is used in a device that is subjected to thermal changes or other changes that cause the thermal expansion of the lead 150 during the operation of the electronic system 420.

A method 500 for manufacturing an electronic device 100, electronic system 420 and a leadframe 600 that includes leads having a reduced cross-sectional area of the lead 150 along at least a portion of the longitudinal length of the lead 130 is provided.

The method 500 includes modifying a leadframe 600 at 502 and 510. A leadframe is provided at 502, such as a standard leadframe 600. The leadframe in one example is formed of conductive material such as copper. The leadframe 600 in one example is in the form of a sheet that has been etched, stamped and/or formed in to a leadframe 600 similar to one illustrated in FIG. 6. The leadframe 600 includes a die pad 610 having a top surface 612 that is adapted to receive a semiconductor die 110. Leads 130 extend outwardly from the die pad 610. A top surface 612 of the die pad 610 and a top surface 132 of the leads 130 generally both lie in a same plane prior to the semiconductor die 110 being attached to the leadframe 600. The leadframe 610 typically includes one or more die pads 610 and associated leads 130 which can typically later be separated from one another by a tiebar cut.

Figure 5:
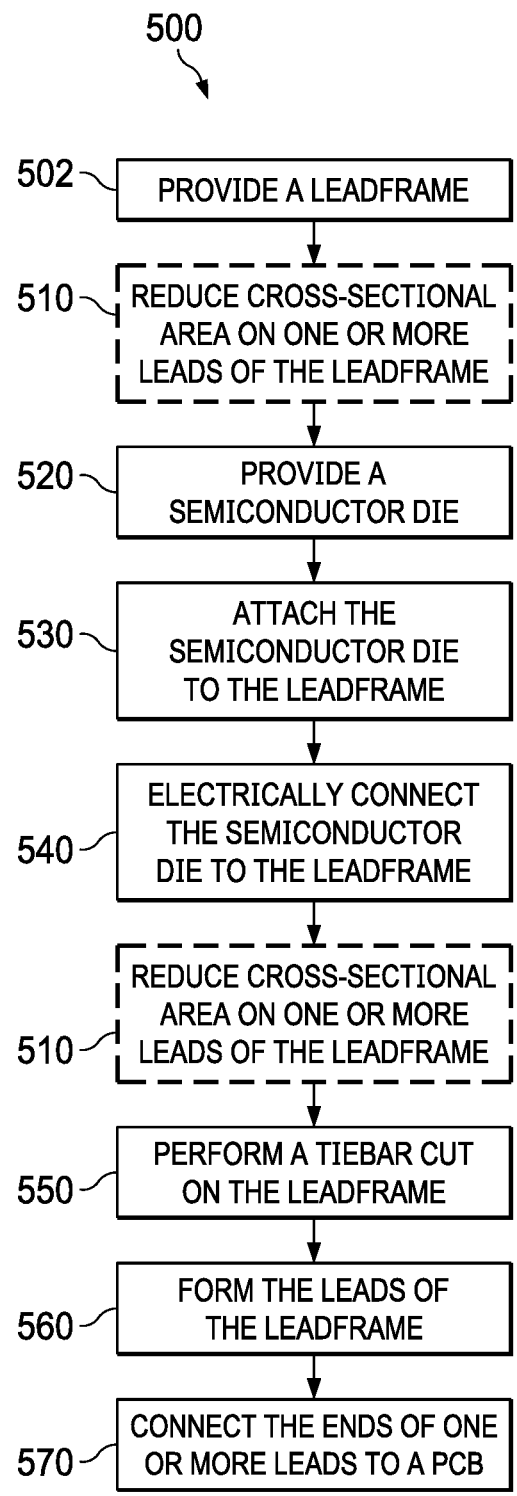
FIG. 5 a flow diagram of a method for forming an electronic device, such as the electronic device of FIGS. 1 and 4.

At 510, leads 130 of the leadframe 600 are etched, cut, stamped, compressed, or otherwise processed to cause portions of the lead 130 along the longitudinal length of the lead to be reduced in cross-sectional area. The configuration of the reduced cross-sectional area regions of the leads 130 can be the same, similar or different from the leads 150 that have been modified as illustrated in FIGS. 9-14. The modified leadframe 600 can then be used to form an electronic device 100. As illustrated in FIG. 5, the cross-sectional area reduction at 510 can occur prior to die attachment or after wire bonding and molding. A reduced cross-sectional area is formed on the leads 130 at 510. The formation of the reduced cross-sectional area can be accomplished in a variety of ways. For example, the reduced cross-sectional area on the leads 130 can be formed by reduced cross-section regions 140 on the lead 130. The reduced cross-section regions 140 can be formed by notches 150. These notches can be formed in the lead by etching, stamping or cutting (e.g., laser cut, etc.). The configuration of the reduced cross-sectional area regions of the leads 130 can be the same, similar or different from the leads 150 that have been modified as illustrated in FIGS. 9-14. The cross-sectional area of the leads in one example is generally based on the particular application that is to include the electronic device 100. The cross-sectional area of the reduced cross-section regions 140 is generally no more than 50% smaller in size to the cross-sectional area of a portion of the lead 130 that is absent the reduced cross-section regions. It has been found that when the cross-sectional area of the reduced cross-section regions 140 is more than 50% smaller in size to the cross-sectional area of a portion of the lead 130 that is absent the reduced cross-section regions, the structural integrity of the lead can be compromised, thereby subject to premature breakage at such reduced cross-sectional region when the electronic system 420 used is one of the various types of devices subject to large thermal changes and/or vibration levels.

Figure 8:
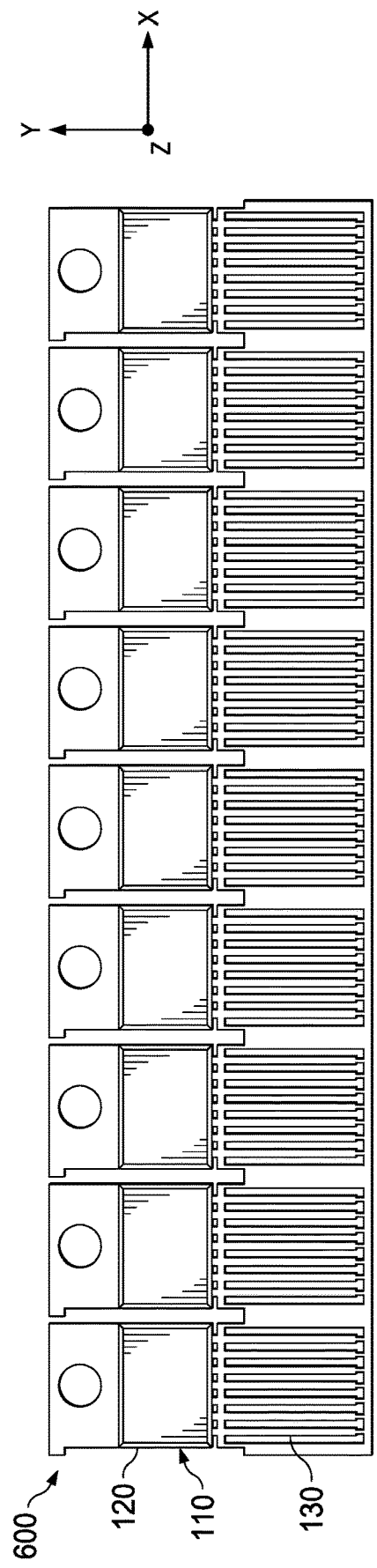
FIG. 8 is a top elevation view of the semiconductor die of FIG. 7 attached to the leadframe of FIG. 6.
Figure 7:
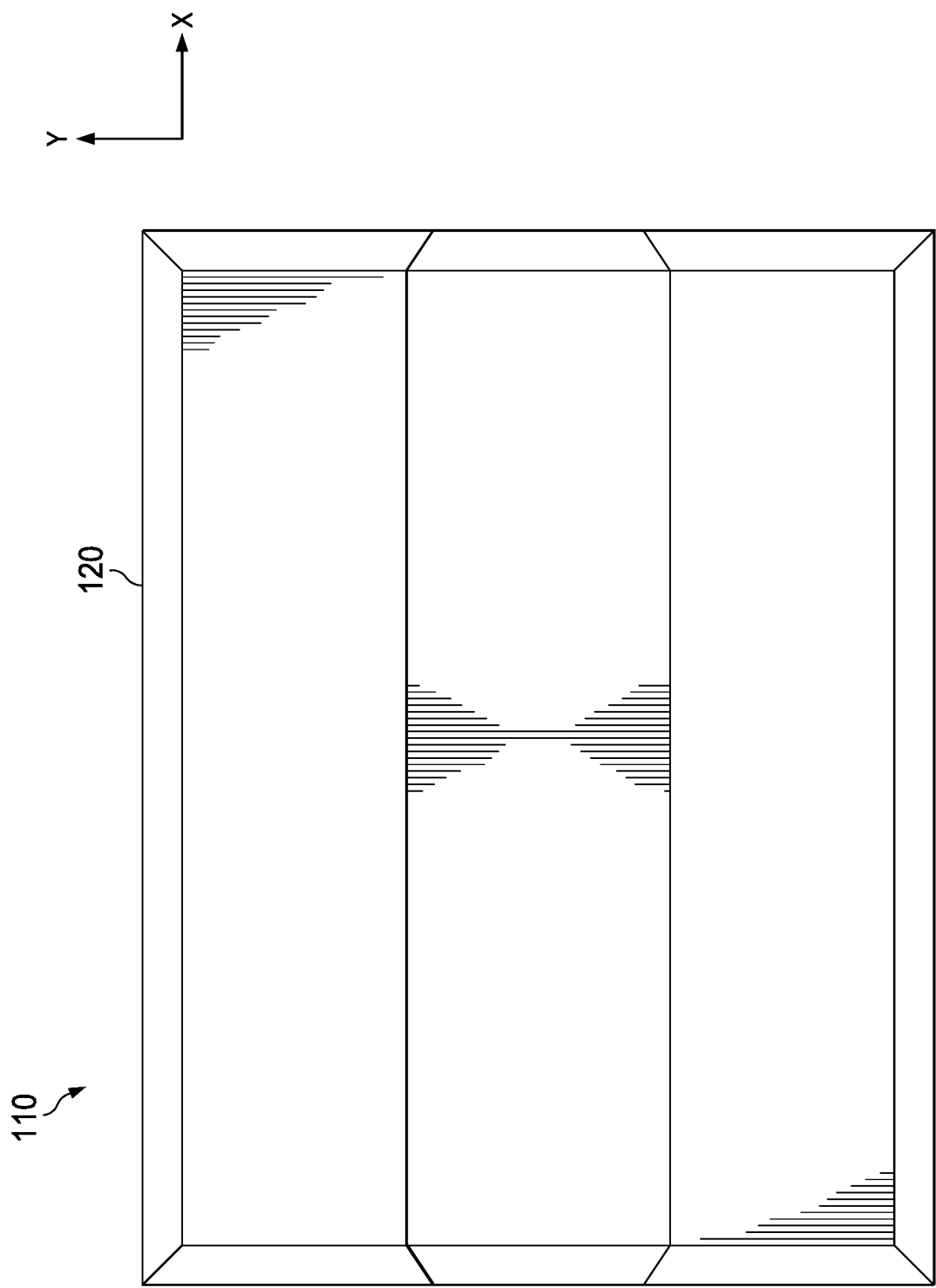
FIG. 7 is a top plan view of a semiconductor die that can be used to form the electronic device of FIG. 1.

At 520, a semiconductor die 110 is provided that is to be attached to leads 130 of the leadframe 600. One example semiconductor die 110 is illustrated in FIG. 7. At 530 in FIG. 5, a semiconductor die 110 is attached to the top surface 612 of the die pad 610 of the leadframe 600 as illustrated in FIG. 8. The attachment can be by use of an adhesive, epoxy, solder or other type of connection arrangement. When the leadframe 600 includes one than one die pad 610, a semiconductor die 110 is attached to the top surface 612 of each of the die pads 610.

At 540, the semiconductor die 110 is electrically connected to the leadframe 600. Such electrical connection can be accomplished by the use of an electrically conductive solder, electrically-conductive epoxy, etc. The electrical connection can be accomplished by the use of bonding wires (not shown) which are typically formed of gold, copper or some other electrically-conductive metal. One of the bonding wires is electrically connected to an electrical connection point such (not shown) on the semiconductor die 110. The bonding wires are typically formed of gold, copper or some other electrically conductive metal, and the other end of the bonding wire is connected to a portion of the leadframe 130 such as to one of the leads 130. The ends of the bonding wires can be connected to the leads 130 and semiconductor die 110 by use of an electrically-conductive solder, electrically-conductive epoxy, etc. After the semiconductor die 110 is electrically connected to the leads 130, a plastic enclosure 120 can optionally be positioned about a portion of the semiconductor die 110, such as by molding.

If not previously performed prior to die attachment, the lead cross sectional area reduction is performed at 510 after molding to reduce the cross-sectional area of portions of the lead 130 along the longitudinal length of the lead. In one example, the lead cross sectional area reduction is performed both prior to die attach and after molding to further customize the cross-sectional shape of the leads 130.

Figure 6:
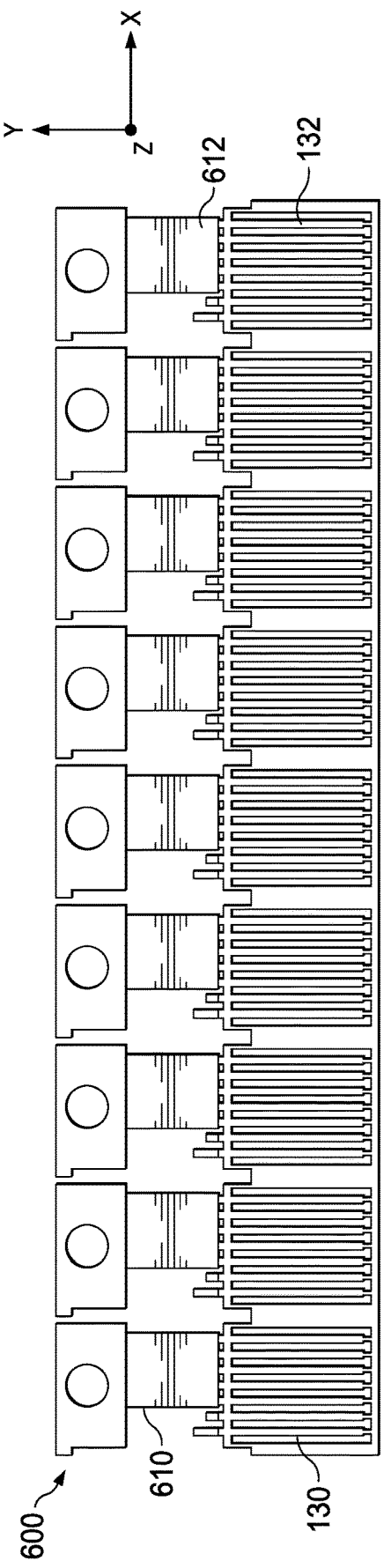
FIG. 6 is a top elevation view of a leadframe that can be used to form the electronic device of FIG. 1.
Figure 15:
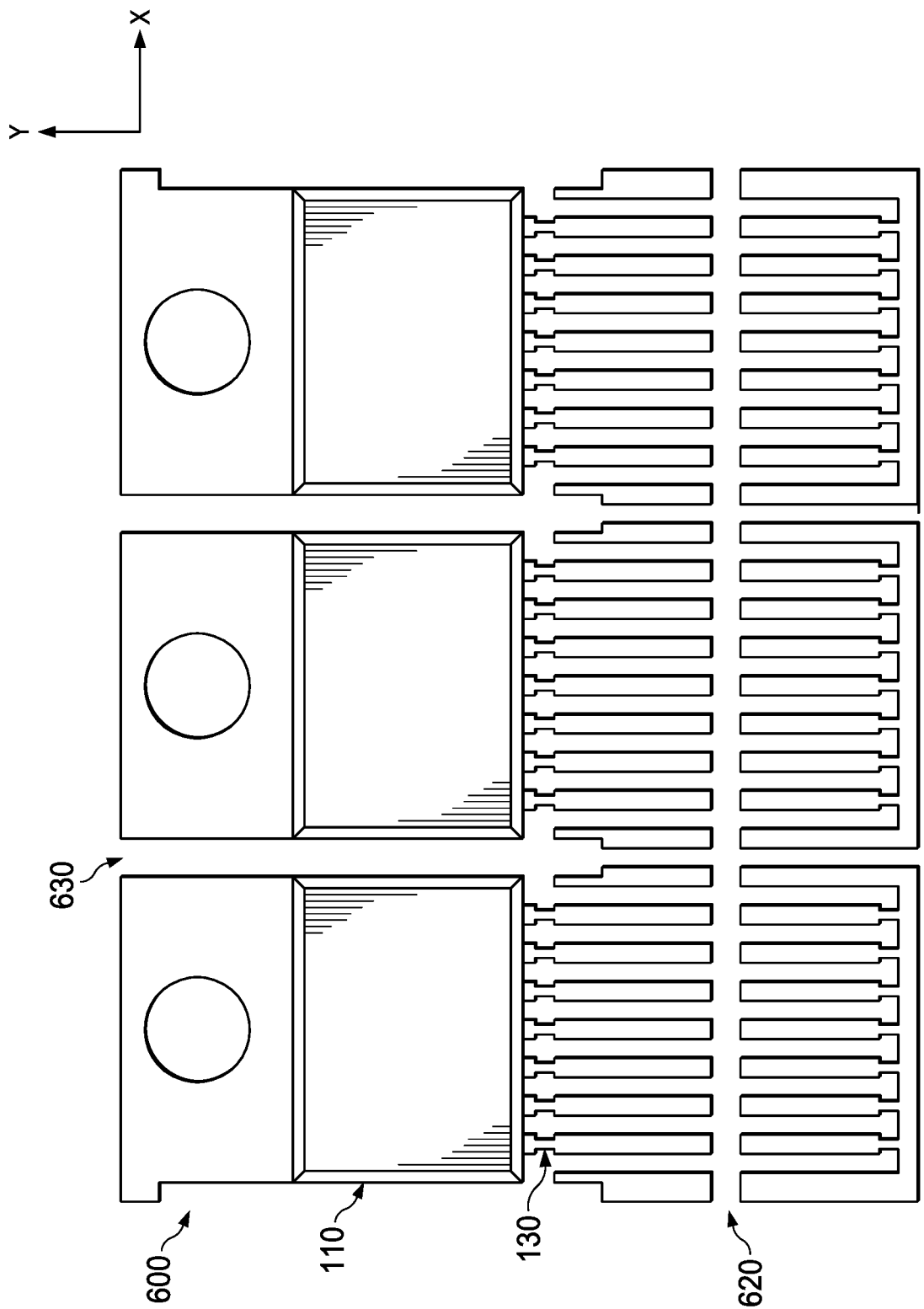
FIG. 15 is a top plan view of a tiebar cut of a portion of the leadframe that includes the semiconductor die of FIG. 8.
Figure 16:
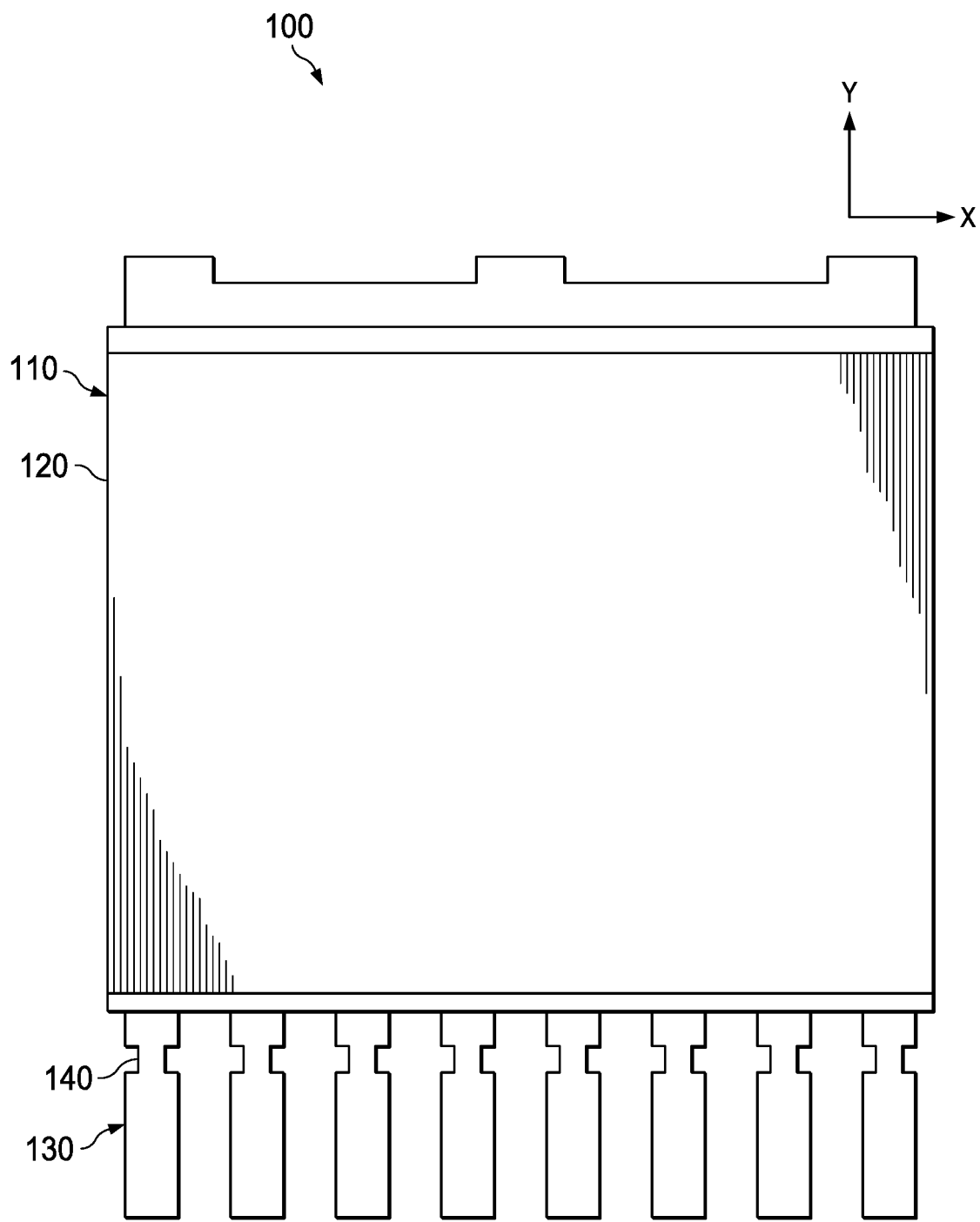
FIG. 16 is a top plan view of the electronic device prior to the bending of the leads and therein a reduced cross-section region is on each of the leads; and, FIG. 17 illustrates different solder connections between the leads and a PCB.

At 550, a tiebar cut is performed on the leadframe to separate the individual electronic devices 100 from one another. FIG. 15 illustrated the tiebar cut of a portion of the leadframe 600 that is illustrated in FIG. 6. A cut 630 is used to separate the individual electronic devices 100 from one another. A cut 620 is used to cut off the unneeded portion of the leads 130 and to separate the ends of the leads 130 from one another. Cuts 620, 630 can be performed by stamping, etching, laser cut, etc. Any unneeded portion of the leadframe 600 that extends rearwardly from the semiconductor die 110 can also be removed during the tiebar cut. An individual electronic device 100 that has been formed after the tiebar cut is illustrated in FIG. 16.

At 560, the leads 130 are bent into a desired shape (e.g., J leads or gull-wing leads) to form the final electronic device 100 as illustrated in FIGS. 1-3. In one example, the bending process is used to bend the leads to form a bent portion 210 and a flat portion 220. The bent portion 210 is positioned between the enclosure 120 and the flat portion 220. The flat portion 220 is configured to be connected to the printed circuit board 400. The reduced cross-section regions 140 on the leads 130 can be located on the bent portion 210 and/or the flat portion 220. In one example configuration, of the reduced cross-section regions 140 are located on the bent portion 210 of the leads 130. The leads can be bent into any desired configuration to form the desired shaped of the lead (e.g., J-wing lead, gull-wing lead, etc.). The leads 130 are typically bent after the semiconductor die 110 is attached to the leadframe 600; however, this is not required. Also, the leads are typically bent after the formation of the reduced cross-sectional areas along the longitudinal length of the lead 130; however, this is not required. Also, the leads are typically bent or formed after the tiebar cut, however, this is not required.

Processing at 502-570 also provides for fabricating an electronic system 420. The electronic system 420 fabrication at 570 also includes electrically connecting the leads 130 on the electronic device 100 to the PCB 400 (e.g., FR4 PCB, etc.) as illustrated in FIG. 4. The leads 130 are typically connected to the PCB 400 by use of an electrically conductive solder, electrically conductive epoxy, etc. In one example, the connection of the leads to the PCB is by use of an electrical connector 410 such as an electrically-conductive solder (e.g., metallic solder). The PCB typically includes metal connection points (not shown) to which the leads 130 on the electronic device 100 are electrically connected.

Figure 17:
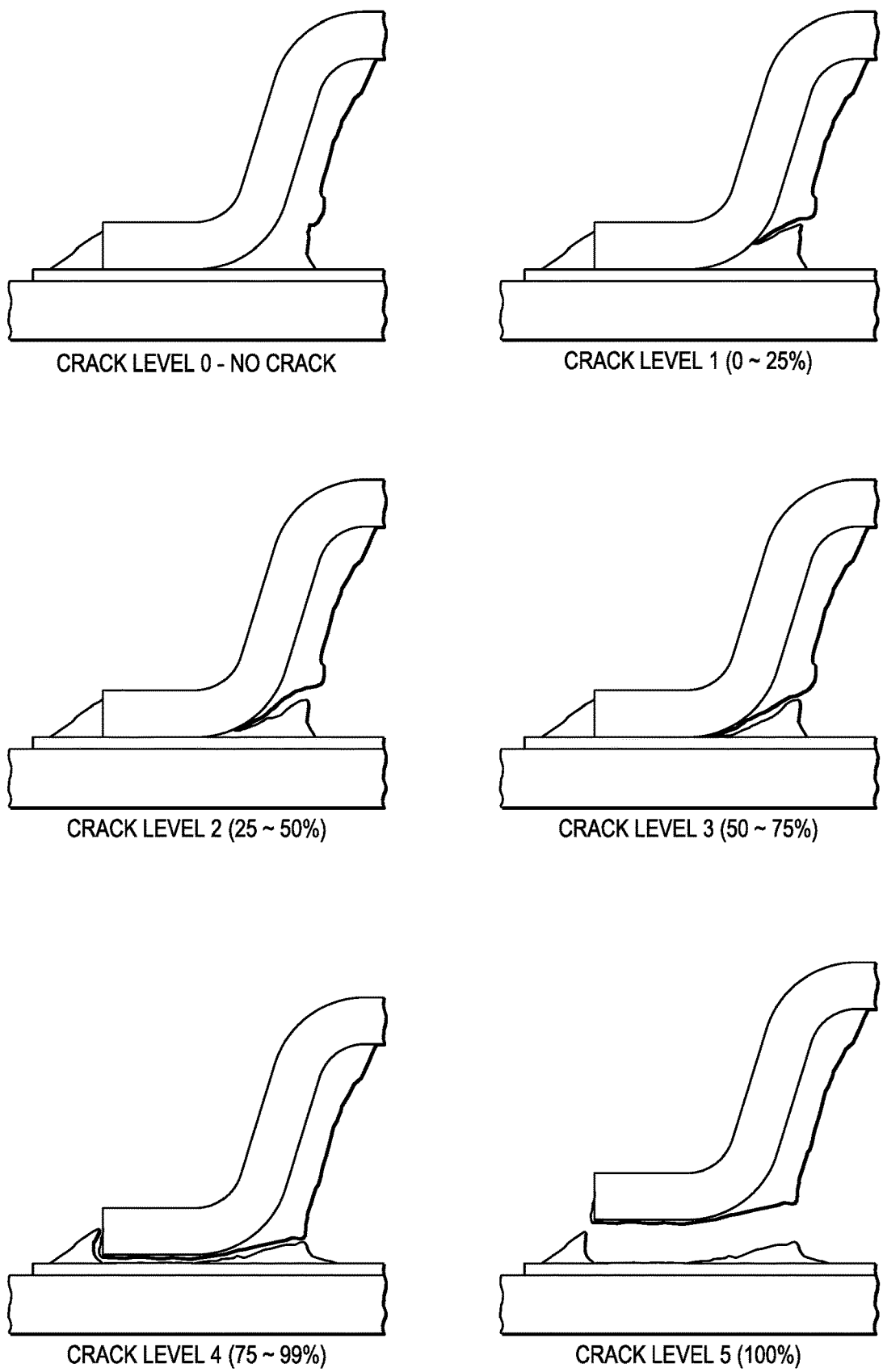

FIG. 17 includes several illustrations of different levels of crack formation in the solder between the lead and the PCB. Crack Level 0 represents no crack formation in the solder between the lead and the PCB. Crack Level 1 illustrates a crack that has formed in the solder between the lead and the PCB and affects no more than 25% of the connection between lead and the PCB. Crack Level 2 illustrates a crack that has formed in the solder between the lead and the PCB and affects more than 25% and up to 50% of the connection between lead and the PCB. Crack Level 3 illustrates a crack that has formed in the solder between the lead and the PCB and affects more than 50% and up to 75% of the connection between lead and the PCB. Crack Level 4 illustrates a crack that has formed in the solder between the lead and the PCB and affects more than 75% and up to 99% of the connection between lead and the PCB. Crack Level 5 illustrates a crack that has formed in the solder such that the lead is disconnected from the PCB. A Crack Level of 2-5 in the solder connection can result in the malfunction or failure of the semiconductor die that is used in a device. It has been found that, for some devices exposed to large thermal changes during the operation of the device, cracks can form between the lead and the PCB. Once a crack is formed, it can continue to grow over time from a Level 1 crack to a Level 5 crack thereby resulting in eventual malfunction or failure of the leaded device. FIG. 17 illustrates six different representations of an electrical connector 410 in the form of a solder connection between the leads and the PCB. Representation 1 illustrates a solder connection between the leads and the PCB that is absent any crack in the solder connection. Representation 1 designates that absence of a crack in the solder connection as Crack Level 0. At the time of completion of the manufacture of the electronic system 420, a Crack Level 0 typically exists for all solder connections. Representations 2-6 illustrate various degrees of crack formation in the solder connection from just above 0% to 100%.

Modifications are possible in the described embodiments, and other embodiments are possible, within the scope of the claims.

What is claimed is:

1. An electronic device comprising:
   a semiconductor die;
   an enclosure that encloses a portion of the semiconductor die; and
   leads extending outwardly from the enclosure and electrically connected to the semiconductor die, some but not all of same width ones of the leads having a reduced cross-sectional area along a longitudinal length of the lead outside of the enclosure.

2. The electronic device of claim 1, wherein the reduced cross-sectional area on the same width ones of the leads includes a slot, a notch, a grove, or a compressed region.

3. The electronic device of claim 2, wherein the reduced cross-sectional area on the same width ones of the leads includes the slot, the notch, the grove, or the compressed region located on a top surface, a bottom surface, a right side or a left side of the lead.

4. The electronic device of claim 1, wherein at least one of the same width ones of the leads includes a bent portion and a flat portion, the bent portion positioned between the enclosure and the flat portion, the flat portion configured to be connected to a circuit board, the reduced cross-section area located on the bent portion and/or the flat portion.

5. The electronic device of claim 1, wherein the reduced cross-section area has a cross-sectional area that is 5% to 50% smaller in size to a cross-sectional area of a portion of the lead that is absent the reduced cross-section area.

6. An electronic device comprising:
   a semiconductor die;
   an enclosure that encloses a portion of the semiconductor die; and
   leads extending outwardly from the enclosure and electrically connected to the semiconductor die, some but not all of same width ones of the leads having a reduced cross-sectional area along a longitudinal length of the lead, wherein each of the same width ones of the some but not all of the same width ones of the leads has a same number, size or shape of reduced cross-section regions.

7. The electronic device of claim 1, wherein the same width ones of the leads have a different number, size or shape of reduced cross-section regions.

8. The electronic device of claim 1, wherein the leads are J-wing leads or gull-wing leads.

9. A method for forming an electronic device comprising:
   providing a leadframe having leads;
   providing a semiconductor die;
   attaching the semiconductor die to the leadframe;
   electrically connecting the semiconductor die to leads of the leadframe; and
   reducing a cross-sectional area of some but not all of same width ones of the leads along a longitudinal length of the lead adjacent a non-horizontal bend in the lead.

10. The method of claim 9, wherein reducing the cross-sectional area of the same width ones of the leads occurs prior to the attaching the semiconductor die to the leadframe.

11. The method of claim 9, further including bending the leads to form J-wing leads or gull-wing leads, the bending occurring after the reducing the cross-sectional area of the leads.

12. The method of claim 9, further including preforming a tiebar cut on the leadframe.

13. The method of claim 12,
    wherein the leadframe includes a first die pad and a second die pad, wherein each of the die pads is configured to receive a single semiconductor die;
    the method further including:
    (a) attaching a first semiconductor die to the first die pad and attaching a second semiconductor die to the second die pad, and
    (b) electrically connecting the first and second semiconductor dies to the leads of the leadframe, the tiebar cut separating the semiconductor dies from one another to form first and second electronic devices.

14. The method of claim 9, further including electrically connecting the leads of the electronic device to a printed circuit board.

15. The method of claim 14, wherein electrically connecting the leads of the electronic device to the printed circuit board includes soldering the leads of the electronic device to conductive pads of the printed circuit board is by a metallic solder.

16. A leadframe, comprising:
    a die pad; and
    first and second same width leads, a top surface of the die pad and a top surface of the first and second same width leads lying in a plane, the first but not the second same width lead having a reduced cross-sectional area along a longitudinal length of the first same width lead.

17. The leadframe of claim 16, wherein the reduced cross-section area of the first same width lead is between 5% to 50% smaller in size to a cross-sectional area of a portion of the first lead same width lead that is absent the reduced cross-section area.

18. An electronic system comprising:
    an electronic device, including:
      a semiconductor die,
      an enclosure that encloses a portion of the semiconductor die, and
      leads electrically connected to the semiconductor die and extending outwardly from the enclosure, some but not all of same width ones of the leads having a reduced cross-sectional first portion outside of the enclosure between adjacently positioned second and third portions along a longitudinal length of the leads, the reduced cross-sectional first portion having a smaller cross-sectional area than cross-sectional areas of the second and third portions; and
    a printed circuit board, including conductive pads soldered to the leads of the electronic device.

19. The electronic system of claim 18, wherein the reduced cross-section portions have a cross-sectional area that is 5% to 50% smaller in size to a cross-sectional area of a portion of the lead that is absent the reduced cross-section portions.

20. The electronic system of claim 18, wherein at least one of the same width ones of the leads includes a bent portion and a flat portion, the bent portion positioned between the enclosure and the flat portion, the flat portion configured to be soldered to the conductive pad of the printed circuit board, the reduced cross-section portions located on the bent portion and/or the flat portion, the flat portion electrically connected to the printed circuit board.

21. The electronic device of claim 1, further including a second reduced cross-sectional area along a same surface of the longitudinal length of the same width lead.

22. The electronic device of claim 21, wherein a length of the reduced cross-sectional area is the same as a length of the second reduced cross-sectional area along a same surface of the longitudinal length of the same width lead.

23. The electronic device of claim 21, wherein a length of the first reduced cross-sectional area is different than a length of the second reduced cross-sectional area along a same surface of the longitudinal length of the same width lead.

24. The electronic device of claim 2, wherein the reduced cross-sectional area on the same width leads includes the slot, the notch, the grove, or the compressed region located on a top surface, a bottom surface, a right side and a left side of the lead.

25. An electronic device comprising:
a semiconductor die;
an enclosure that encloses a portion of the semiconductor die; and
leads extending outwardly from the enclosure and electrically connected to the semiconductor die, some but not all of same width ones of the leads having a reduced cross-sectional area along a longitudinal length of the lead, wherein at least one of the same width leads having a reduced cross-sectional area along a longitudinal length of the lead includes a bent portion and a flat portion, the bent portion positioned between the enclosure and the flat portion, the flat portion configured to be connected to a circuit board, the reduced cross-section regions located on the flat portion but not on the bent portion.

26. The method of claim 9, further including reducing a second reduced cross-sectional area along a same surface of the longitudinal length of the same width lead.

27. The method of claim 26, wherein a length of the reduced cross-sectional area is the same as a length of the second reduced cross-sectional area along a same surface of the longitudinal length of the same width lead.

28. The method of claim 26, wherein a length of the reduced cross-sectional area is different than a length of the second reduced cross-sectional area along a same surface of the longitudinal length of the same width lead.

29. The method of claim 9, wherein the reduced cross-sectional area on the leads includes a slot, a notch, a grove, or a compressed region located on a top surface, a bottom surface, a right side and a left side of the same width lead.

30. A method for forming an electronic device comprising:
providing a leadframe having leads;
providing a semiconductor die;
attaching the semiconductor die to the leadframe;
electrically connecting the semiconductor die to leads of the leadframe; and
reducing a cross-sectional area of some but not all of same width ones of the leads along a longitudinal length of the lead, wherein at least one of the same width ones of the leads having a reduced cross-sectional area along a longitudinal length of the lead includes a bent portion and a flat portion, the bent portion positioned between the enclosure and the flat portion, the flat portion configured to be connected to a circuit board, the reduced cross-section area located on the flat portion but not the bent portion.

31. The electronic system of claim 18, further including a second reduced cross-sectional area along a same surface of the longitudinal length of the same width lead.

32. The electronic system of claim 31, wherein a length of the reduced cross-sectional first portion is the same as a length of the reduced cross-sectional second portion along a same surface of the longitudinal length of the same width lead.

33. The electronic system of claim 31, wherein a length of the first reduced cross-sectional area is different than a length of the second reduced cross-sectional area along a same surface of the longitudinal length of the same width lead.

34. The electronic system of claim 18, wherein the reduced cross-sectional first portion on the leads includes a slot, a notch, a grove, or a compressed region located on a top surface, a bottom surface, a right side and a left side of the same width lead.

35. An electronic system comprising:
an electronic device, including:
a semiconductor die,
an enclosure that encloses a portion of the semiconductor die, and
leads electrically connected to the semiconductor die and extending outwardly from the enclosure, some but not all of same width ones of the leads having a reduced cross-sectional first portion between adjacently positioned second and third portions along a longitudinal length of the leads, the reduced cross-sectional first portion having a smaller cross-sectional area than cross-sectional areas of the second and third portions, wherein at least one of the same width leads having a reduced cross-sectional first portion along a longitudinal length of the same width lead includes a bent portion and a flat portion, the bent portion positioned between the enclosure and the flat portion, the flat portion configured to be connected to a circuit board, the reduced cross-section portions located on the flat portion but not on the bent portion; and
a printed circuit board, including conductive pads soldered to the leads of the electronic device.

36. An electronic device comprising:
a semiconductor die;
an enclosure that encloses a portion of the semiconductor die; and
leads extending outwardly from the enclosure and electrically connected to the semiconductor die, some but not all of the leads having a slot-shaped reduced cross-sectional area formed in a top surface of the leads.

37. The electronic device of claim 36, wherein the slot is spaced within left and right sides of the leads.

38. The electronic device of claim 36, further including a slot formed in a bottom surface of the leads runs at least partially along the longitudinal length of the leads.

39. A method for forming an electronic device comprising:
providing a leadframe having leads;
providing a semiconductor die;
attaching the semiconductor die to the leadframe;

electrically connecting the semiconductor die to leads of the leadframe; and forming a slot in a top surface of some but not all of the leads running at least partially along the longitudinal length of the leads.

40. The method of claim 39, wherein the slot is spaced within left and right sides of the leads.

41. The method of claim 39, further including forming a slot in a bottom surface of the leads running at least partially along the longitudinal length of the leads.

* * * * *